(12) United States Patent
Liu

(10) Patent No.: US 11,968,801 B2
(45) Date of Patent: Apr. 23, 2024

(54) FAN CONTROL SYSTEM AND METHOD

(71) Applicants: INVENTEC (PUDONG) TECHNOLOGY CORPORATION, Shanghai (CN); INVENTEC CORPORATION, Taipei (TW)

(72) Inventor: Ye Liu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 260 days.

(21) Appl. No.: 17/355,927

(22) Filed: Jun. 23, 2021

(65) Prior Publication Data

US 2022/0295665 A1  Sep. 15, 2022

(30) Foreign Application Priority Data

Mar. 11, 2021 (CN) .......................... 202110267629.2

(51) Int. Cl.
| | |
|---|---|
| H05K 7/20 | (2006.01) |
| G05D 23/00 | (2006.01) |
| G06F 1/20 | (2006.01) |
| G06F 11/30 | (2006.01) |

(52) U.S. Cl.
CPC ......... *H05K 7/20209* (2013.01); *G05D 23/00* (2013.01); *G06F 1/206* (2013.01); *G06F 11/3062* (2013.01); *H05K 7/20172* (2013.01)

(58) Field of Classification Search
CPC ... G06F 1/3206; G06F 1/325; H05K 7/20209; H05K 7/20736
See application file for complete search history.

(56) References Cited

U.S. PATENT DOCUMENTS

| | | | |
|---|---|---|---|
| 7,203,847 B2 * | 4/2007 | Park ..................... | G06F 1/3203 713/300 |
| 10,942,195 B1 * | 3/2021 | Kom .................. | H05K 7/20572 |
| 2005/0066672 A1 * | 3/2005 | Yamamoto ............. | G06F 1/206 62/186 |

(Continued)

FOREIGN PATENT DOCUMENTS

| | | |
|---|---|---|
| CN | 101464827 A | 6/2009 |
| CN | 103381078 A | 11/2013 |

(Continued)

*Primary Examiner* — Vincent H Tran

(74) *Attorney, Agent, or Firm* — Muncy, Geissler, Olds & Lowe, P.C.

(57) ABSTRACT

A fan control system for use in a server system is disclosed. The fan control system includes a first monitoring and protection chip, a second monitoring and protection chip, a switch, a plurality of fans and a complex programmable logic device (CPLD). In a shutdown state of the server system, the switch is switched under control of the CPLD so that the fans are connected to the second monitoring and protection chip, receive standby power therefrom and run at a standby power level. When the server system is switched to a working state, the switch is switched under control of the CPLD so that the fans are connected to the first monitoring and protection chip, receive operating power therefrom and run at a higher working power level. This design can address different heat dissipation needs of various applications.

8 Claims, 2 Drawing Sheets

(56) References Cited

U.S. PATENT DOCUMENTS

| | | | | |
|---|---|---|---|---|
| 2007/0097721 A1* | 5/2007 | Chou | H05K 7/20209 | 363/141 |
| 2008/0106228 A1* | 5/2008 | Ye | H05K 7/20209 | 361/695 |
| 2008/0165493 A1* | 7/2008 | Chen | G06F 1/206 | 361/679.48 |
| 2014/0115348 A1* | 4/2014 | Sun | G06F 1/3287 | 713/300 |
| 2014/0119882 A1* | 5/2014 | Chen | F04D 27/004 | 415/30 |
| 2014/0181562 A1* | 6/2014 | Das | G06F 1/20 | 713/324 |
| 2015/0106638 A1* | 4/2015 | Sun | G06F 1/266 | 713/323 |
| 2015/0149807 A1* | 5/2015 | Yen | G06F 1/324 | 713/340 |
| 2015/0286274 A1* | 10/2015 | Shih | G06F 1/3206 | 713/323 |
| 2017/0027080 A1* | 1/2017 | Jang | H05K 7/20209 | |
| 2017/0142280 A1* | 5/2017 | Koiwai | H04N 1/00204 | |
| 2017/0351306 A1* | 12/2017 | Kim | G06F 1/266 | |
| 2020/0203949 A1* | 6/2020 | Imamura | G05F 1/26 | |
| 2021/0109588 A1* | 4/2021 | Wang | F04D 19/002 | |
| 2021/0191492 A1* | 6/2021 | Wang | G06F 1/3296 | |

FOREIGN PATENT DOCUMENTS

| | | |
|---|---|---|
| CN | 103777721 A | 5/2014 |
| CN | 106968978 A | 7/2017 |
| CN | 109488628 A | 3/2019 |
| CN | 110597373 A | 12/2019 |
| CN | 110739661 A | 1/2020 |
| TW | 200825685 A | 6/2008 |
| TW | 201421212 A | 6/2014 |

* cited by examiner

FAN CONTROL SYSTEM AND METHOD

CROSS-REFERENCES TO RELATED APPLICATION

This application claims the priority of Chinese patent application number 202110267629.2, filed on Mar. 11, 2021, the entire contents of which are incorporated herein by reference.

TECHNICAL FIELD

The present invention relates to a system and method, in particular, for fan control.

BACKGROUND

With the development of technology, server systems are finding increasingly extensive applications and are ever evolving and improving to address diverse needs of companies or individual users in various fields. In general, a server system can assume one of six possible states S0-S5. The system is turned on and works normally in the state S0 and is turned off in the state S5. Notably, the state S5 is a soft off state in which the server system shuts down but is still plugged in the outlet, i.e., receives mains power from the outlet.

Typically, fans in a server system work only in S0 but not in S5. However, as the demand for data processing is growing, depending on applications, certain components in the server system may become necessary to operate in the state S5. This increases the heat dissipation burden in the state S5 and may make it insufficient for the fans to operate only in the state S0. There is therefore a need for improvements over the prior art.

SUMMARY OF THE INVENTION

In view of the various problems with the prior-art server systems arising from the increasing heat dissipation burden, it is a principal object of the present invention to provide a fan control system and method, which solves at least one of the problems with the prior art.

To this end, the present invention provides a fan control system for use in a server system including a power supply unit. The fan control system includes a first monitoring and protection chip, a second monitoring and protection chip, a switch, a plurality of fans and a complex programmable logic device (CPLD). The first monitoring and protection chip is electrically connected to the power supply unit and is configured to receive operating power in a working state of the server system. The second monitoring and protection chip is electrically connected to the power supply unit and configured to receive standby power in a shutdown state of the server system. The switch is electrically connected to both the first and second monitoring and protection chips. The fans are all electrically connected to the switch.

The CPLD is electrically connected to the first monitoring and protection chip, the second monitoring and protection chip, the switch and the fans and is configured to activate the second monitoring and protection chip in response to detecting that the second monitoring and protection chip has received the standby power in the shutdown state of the server system and switch the switch so that the fans are connected to the second monitoring and protection chip, receive the standby power therefrom and run at a standby power level. It is also configured to activate the first monitoring and protection chip in response to detecting that the first monitoring and protection chip has received the operating power and switch the switch so that the fans are connected to the first monitoring and protection chip, receive the operating power therefrom and run at a normal power level that is higher than the standby power level.

Optionally, the first monitoring and protection chip may be implemented as an ADM1278 chip.

Optionally, the second monitoring and protection chip may be implemented as an MP5023 chip.

Optionally, the switch may include at least a metal-oxide-semiconductor field effect transistor (MOSFET).

On the basis of the same inventive concept, the present invention also provides a fan control method, which is carried out by the above fan control system and includes the steps of: activating the second monitoring and protection chip by the CPLD in the shutdown state of the server system; receiving the standby power at the second monitoring and protection chip; switching the switch under control of the CPLD so that the fans are connected to the second monitoring and protection chip, receive the standby power therefrom and run at the standby power level; activating the first monitoring and protection chip by the CPLD when the server system is switched from the shutdown state to the working state; receiving the operating power at the first monitoring and protection chip; and switching the switch under control of the CPLD so that the fans are connected to the first monitoring and protection chip, receive the operating power therefrom and run at the normal power level.

Optionally, the fan control method may further include the step of deactivating the first monitoring and protection chip by the CPLD when the server system is switched from the working state back to the shutdown state so that the process loops back to the above step.

Optionally, the first monitoring and protection chip may be implemented as an ADM1278 chip.

Optionally, the second monitoring and protection chip may be implemented as an MP5023 chip.

Compared with the prior art, in the system of the present invention that includes the CPLD, the switch, the first and second monitoring and protection chips and the fans, the first and second monitoring and protection chip is activated depending on a detected state of the server system, and the fans are caused to run at the lower standby power level in the shutdown state and at the higher working power level in the working state, thus addressing different heat dissipation needs of various applications.

Additionally, making determinations using the CPLD rather than a baseboard management controller (BMC) as in the prior art allows the present invention to be further applicable to server systems not equipped with a BMC. For BMC-equipped server systems, this is helpful in offloading of the BMC.

LIST OF REFERENCE NUMERALS IN THE DRAWINGS

1 Fan Control System
11 First Monitoring and Protection Chip
12 Second Monitoring and Protection Chip 13 Switch
14 Fan
15 Complex Programmable Logic Device (CPLD)
2 Server System
21 Power Supply Unit

DETAILED DESCRIPTION

Specific embodiments of the present invention will be described below in greater detail with reference to the appended schematic drawings. Features and advantages of the invention will be more readily apparent from the following detailed description, and from the appended claims. It is noted that the figures are presented in a very simplified form not necessarily drawn to exact scale for the only purpose of helping to explain the disclosed embodiments in a more convenient and clearer way.

Figure 1:
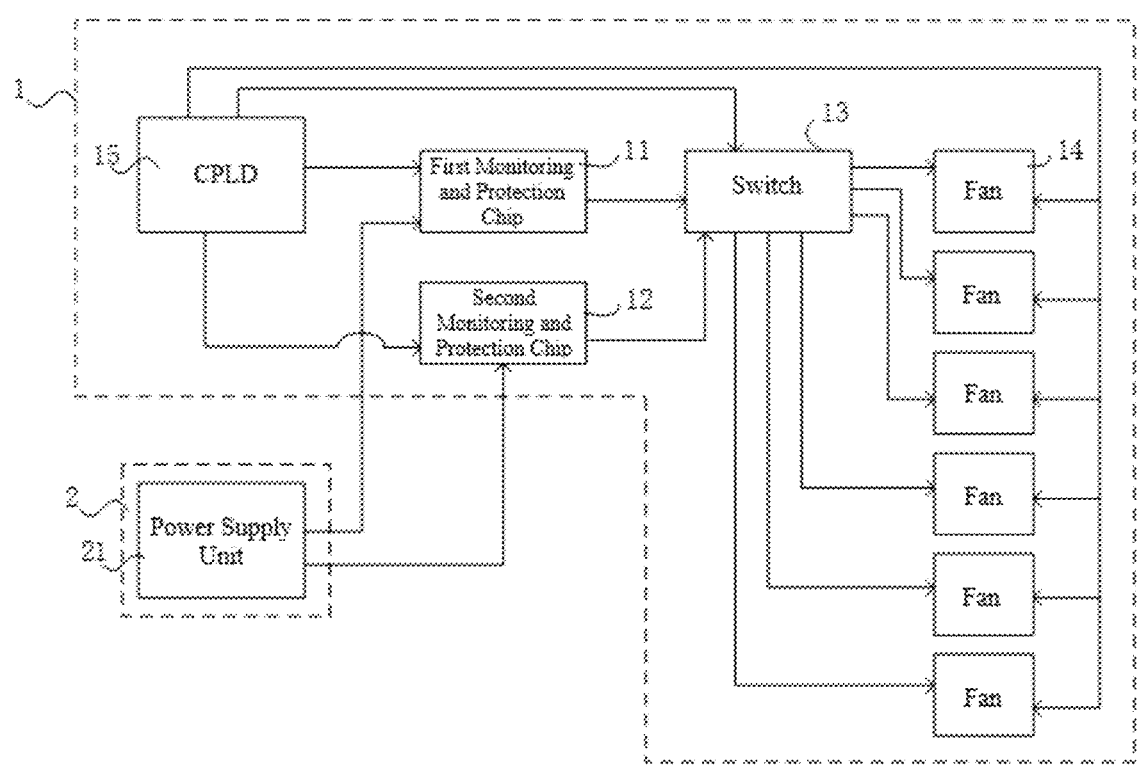
FIG. 1 shows a block diagram of a fan control system according to a first embodiment of the present invention.
Figure 2:
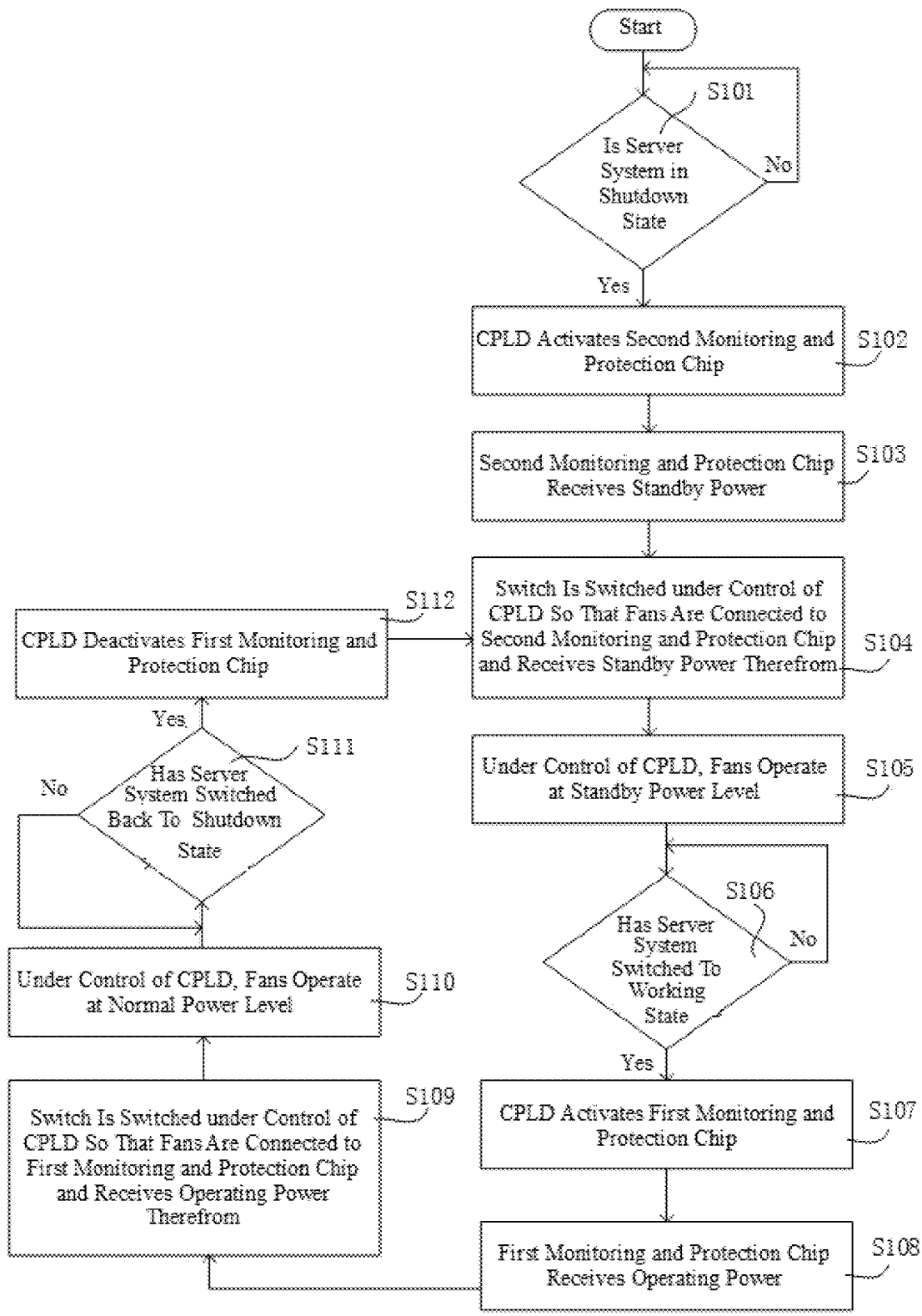
FIG. 2 is a flowchart of a fan control method according to the first embodiment of the present invention.

Reference is now made to FIG. 1, a block diagram of a fan control system according to a first embodiment of the present invention, and to FIG. 2, a flowchart of a fan control method according to the first embodiment of the present invention. As shown, the fan control method is carried out by the fan control system 1 and includes steps S101-S112 as detailed below.

The fan control system 1 is used in a server system 2 including at least a power supply unit 21. The fan control system 1 includes a first monitoring and protection chip 11, a second monitoring and protection chip 12, a switch 13, a plurality of fans 14 (six are shown and one of them is labeled) and a complex programmable logic device (CPLD) 15.

The first monitoring and protection chip 11 is electrically connected to the power supply unit 21. The second monitoring and protection chip 12 is also electrically connected to the power supply unit 21. One end of the switch 13 is electrically connected to the first and second monitoring and protection chips 11, 12, and the other end is electrically connected to the fans 14. The CPLD 15 is electrically connected to the first monitoring and protection chip 11, the second monitoring and protection chip 12, the switch 13 and the fans 14.

In step S101, it is determined whether the server system is in a shutdown state. Here, the shutdown state refers to a state in which the server system 2 appears to be off but is still plugged in the outlet, i.e., the state S5. In this state, the server system 2 still receives mains power from the outlet. The determination in step S101 can be made by the CPLD 15. If the determination step S101 is positive, the process proceeds to step S102. Otherwise, step S101 will be repeated.

In step S102, the CPLD activates the second monitoring and protection chip.

In practice, the CPLD 15 may activate the second monitoring and protection chip 12 by providing it with a power enable signal.

In step S103, the second monitoring and protection chip receives standby power. The second monitoring and protection chip 12 may receive standby power in the shutdown state (S5) of the server system 2. Standby power, also known as backup power or reserve power, refers to power delivered from the power supply unit 21 in the state of the server system 2 where it appears to be off but is still plugged in the outlet. In this embodiment, the second monitoring and protection chip 12 is implemented as an MP5023 chip capable of current and power consumption monitoring and overcurrent protection (OCP).

In step S104, the switch is switched under control of the CPLD so that the fans are connected to the second monitoring and protection chip and receives the standby power therefrom.

When connected to the second monitoring and protection chip 12 as a result of the switching action of the switch 13 performed under control of the CPLD 15, the fan 14 may receive the standby power from the second monitoring and protection chip 12. The switch 13 with switching capabilities may be composed of, without limitation, a metal-oxide-semiconductor field effect transistor (MOSFET), a bipolar junction transistor (BJT), an insulated gate bipolar transistor (IGBT) or another electronic component.

In step S105, under control of the CPLD, the fans operate at a standby power level.

The CPLD 15 may activate and control the fans 14 so that they operate at a standby power level. Since the server system 2 is in the shutdown state (S5), where only a few special components are operating, powering the fans 14 with the standby power under control of the CPLD 15 can meet the heat dissipation requirements of the server system 2 while avoiding issues such as a waste of electricity. The CPLD 15 may control the power level of the fans 14 by means of a pulse-width modulation (PWM) signal. In practice, the PWM signal usually has a duty cycle of 15% to 25%.

The second monitoring and protection chip 12 may also be electrically connected to other components or devices, such as PCIe slots. Depending on applications, various components or devices may need to operate under standby power in the shutdown state (S5) of the server system 2.

In step S106, it is determined the server system has been switched to a working state.

Here, the working state of the server system 2 refers to the state S0. The determination in the step S106 may be made by the CPLD 15. When the determination in the step S106 is positive, it is known that the server system 2 is fully running with all its components being operable, and the process proceeds to step S107. Otherwise, step S106 is repeated.

In step S107, the CPLD activates the first monitoring and protection chip.

In practice, the CPLD 15 may activate the first monitoring and protection chip 11 by providing it with a power enable signal.

In step S108, the first monitoring and protection chip receives operating power. The first monitoring and protection chip 11 receives operating power in the working state (S0) of the server system 2. Operating power, also known as main power or normal power, or called "real power" in the art, refers to power delivered from the power supply unit 21 when the server system 2 is on. In this embodiment, the first monitoring and protection chip 11 is implemented as an ADM1278 chip capable of current and power consumption monitoring and OCP. As the operating power is higher than the standby power, the first monitoring and protection chip 11 can withstand a maximum current that is higher than a maximum current that the second monitoring and protection chip 12 can withstand.

In step S109, the switch is switched under control of the CPLD so that the fans are connected to the first monitoring and protection chip and receives the operating power therefrom.

When connected to the first monitoring and protection chip 11 as a result of the switching action of the switch 13 performed under control of the CPLD 15, the fans 14 may receive the operating power from the first monitoring and protection chip 11.

In step S110, under control of the CPLD, the fans operate at a normal power level.

The fans 14 may be controlled by the CPLD 15 to run under at a normal power level. Since the server system 2 is in the working state (S0), all its components are activated and operable. Accordingly, the fans 14 caused to run under the higher working power by the CPLD 15 can address the higher heat dissipation requirements of the server system 2 operating in the working state. The CPLD 15 may control the power level of the fans 14 by means of a PWM signal. In practice, the PWM signal usually has a duty cycle of 50%.

In step S111, it is determined whether the server system has been switched back to the shutdown state.

The determination of whether the server system 2 has been switched back to the shutdown state (S5) in step S111 may also be made by the CPLD 15. If the determination in step S111 is positive, the process proceeds to step S112. Otherwise, step S111 is repeated.

In step S112, the CPLD deactivates the first monitoring and protection chip.

When the server system 2 is switched back to the shutdown state (S5), only a few special components remain operable and the heat dissipation burden is reduced. Accordingly, the CPLD 15 may deactivate the first monitoring and protection chip 11. At last, since the server system 2 is again in the shutdown state, the process loops back to step S104 so that the switch 13 is switched under control of the CPLD 15 to connect the second monitoring and protection chip 12 to the fans. As a result, the fans 14 again receive standby power from the second monitoring and protection chip 12.

Notably, the above steps are repeated until the server system 2 is unplugged from the outlet. In this case, as the server system 2 cannot receive mains power, all its components are inoperable, and heat dissipation is not needed any more. Thus, control of the fans 14 is unnecessary and impossible due to loss of power.

In summary, compared with the prior art, in the system of the present invention that includes the CPLD, the switch, the first and second monitoring and protection chips and the fans, the first and second monitoring and protection chip is activated depending on a detected state of the server system, and the fans are caused to run at a low standby power level in the shutdown state and at a high working power level in the working state, thus addressing different heat dissipation needs of various applications.

Additionally, making determinations using the CPLD rather than a baseboard management controller (BMC) as in the prior art allows the present invention to be further applicable to server systems not equipped with a BMC. For BMC-equipped server systems, this is helpful in offloading of the BMC.

The preferred embodiments as described in detail above are intended merely to more clearly explain the features and spirit of the present invention rather than to limit the scope thereof to these disclosed embodiments in any sense. On the contrary, it is intended that various changes and equivalent arrangements are also covered by the scope of the present invention as defined in the appended claims.

What is claimed is:

1. A fan control system for use in a server system, the server system comprising a power supply unit, the fan control system comprising:

a first monitoring and protection chip electrically connected to the power supply unit and configured to receive an operating power in a working state of the server system;

a second monitoring and protection chip electrically connected to the power supply unit and configured to receive a standby power in a shutdown state of the server system;

a switch electrically connected to both the first and second monitoring and protection chips;

a plurality of fans all electrically connected to the switch; and a complex programmable logic device electrically connected to the first monitoring and protection chip, the second monitoring and protection chip, the switch and the plurality of fans, the complex programmable logic device configured to activate the second monitoring and protection chip in response to detecting that the server system is in the shutdown state and switch the switch so that the plurality of fans are connected to the second monitoring and protection chip, receive the standby power therefrom and run at a standby power level, and to activate the first monitoring and protection chip in response to detecting that the server system has been switched to the working state and switch the switch so that the plurality of fans are connected to the first monitoring and protection chip, receive the operating power therefrom and run at a normal power level that is higher than the standby power level, wherein the complex programmable logic device is directly connected to the plurality of fans.

2. The fan control system of claim 1, wherein the first monitoring and protection chip is implemented as an ADM1278 chip.

3. The fan control system of claim 1, wherein the second monitoring and protection chip is implemented as an MP5023 chip.

4. The fan control system of claim 1, wherein the switch comprises at least a metal-oxide-semiconductor field effect transistor.

5. A fan control method, which is carried out by a fan control system for use in a server system, the server system comprising a power supply unit, the fan control system comprising: a first monitoring and protection chip electrically connected to the power supply unit and configured to receive an operating power in a working state of the server system; a second monitoring and protection chip electrically connected to the power supply unit and configured to receive a standby power in a shutdown state of the server system; a switch electrically connected to both the first and second monitoring and protection chips; a plurality of fans all electrically connected to the switch; and a complex programmable logic device electrically connected to the first monitoring and protection chip, the second monitoring and protection chip, the switch and the plurality of fans, wherein the complex programmable logic device is directly connected to the plurality of fans, and the fan control method comprises the steps of:

a) activating the second monitoring and protection chip by the complex programmable logic device in the shutdown state of the server system;

b) receiving the standby power at the second monitoring and protection chip;

c) switching the switch under control of the complex programmable logic device so that the plurality of fans are connected to the second monitoring and protection chip, receive the standby power therefrom and run at a standby power level;
d) activating the first monitoring and protection chip by the complex programmable logic device when the server system is switched from the shutdown state to the working state;
e) receiving the operating power at the first monitoring and protection chip; and
f) switching the switch under control of the complex programmable logic device so that the plurality of fans are connected to the first monitoring and protection chip, receive the operating power therefrom and run at a normal power level that is higher than the standby power level.

6. The fan control method of claim 5, further comprising the step of:
g) deactivating the first monitoring and protection chip by the complex programmable logic device when the server system is switched from the working state back to the shutdown state and looping back to step a).

7. The fan control method of claim 5, wherein the first monitoring and protection chip is implemented as an ADM1278 chip.

8. The fan control method of claim 5, wherein the second monitoring and protection chip is implemented as an MP5023 chip.

* * * * *